US012813261B2

(12) United States Patent
Lin et al.

(10) Patent No.: US 12,813,261 B2
(45) Date of Patent: Nov. 24, 2026

(54) SEMICONDUCTOR PACKAGE AND MANUFACTURING METHOD THEREOF

(71) Applicant: SAMSUNG ELECTRONICS CO., LTD., Suwon-si (KR)

(72) Inventors: Jing Cheng Lin, Suwon-si (KR); Youngkun Jee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 346 days.

(21) Appl. No.: 18/403,462

(22) Filed: Jan. 3, 2024

(65) Prior Publication Data

US 2025/0006582 A1 Jan. 2, 2025

(30) Foreign Application Priority Data

Jun. 29, 2023 (KR) ........................ 10-2023-0084527

(51) Int. Cl.

| | |
|---|---|
| ***H10W 40/10*** | (2026.01) |
| ***H10B 80/00*** | (2023.01) |
| ***H10W 70/60*** | (2026.01) |
| ***H10W 70/685*** | (2026.01) |
| ***H10W 74/10*** | (2026.01) |
| ***H10W 90/00*** | (2026.01) |
| *H10W 74/15* | (2026.01) |

(52) U.S. Cl.

CPC ............ *H10W 40/10* (2026.01); *H10B 80/00* (2023.02); *H10W 70/611* (2026.01); *H10W 70/685* (2026.01); *H10W 74/117* (2026.01); *H10W 90/00* (2026.01); *H10W 90/701* (2026.01); *H10W 74/15* (2026.01); *H10W 90/724* (2026.01); *H10W 90/734* (2026.01)

(58) Field of Classification Search

CPC . H10W 40/10; H10W 70/611; H10W 70/685; H10W 74/117; H10W 90/00; H10W 90/701; H10W 74/15; H10W 90/724; H10W 90/734; H10B 80/00

See application file for complete search history.

(56) References Cited

U.S. PATENT DOCUMENTS

| | | | | |
|---|---|---|---|---|
| 10,074,472 | B2 | 9/2018 | Wang et al. | |
| 10,515,937 | B2 | 12/2019 | Lin et al. | |
| 10,720,416 | B2 | 7/2020 | Chen et al. | |
| 11,393,805 | B2 | 7/2022 | Yu et al. | |
| 2022/0028826 | A1 | 1/2022 | Arifeen et al. | |
| 2022/0320053 | A1 | 10/2022 | Lee et al. | |
| 2022/0344304 | A1 * | 10/2022 | Pan | H10W 40/10 |

FOREIGN PATENT DOCUMENTS

| | | | |
|---|---|---|---|
| CN | 213546307 | U | 6/2021 |

* cited by examiner

*Primary Examiner* — Fernando L Toledo
*Assistant Examiner* — Adam S Bowen
(74) *Attorney, Agent, or Firm* — Sughrue Mion, PLLC

(57) ABSTRACT

A semiconductor package is provided. The semiconductor package includes: a redistribution substrate; a first semiconductor chip provided on a right portion, in a first direction, of the redistribution substrate; a through-post provided on the redistribution substrate in a region adjacent to a left side, in the first direction, of the first semiconductor chip; a heat dissipation chip provided on the first semiconductor chip; and a second semiconductor device provided adjacent to the heat dissipation chip on the through-post. A metal pad and an adhesive layer are provided between the heat dissipation chip and the first semiconductor chip.

20 Claims, 30 Drawing Sheets

SEMICONDUCTOR PACKAGE AND MANUFACTURING METHOD THEREOF

CROSS-REFERENCE TO RELATED APPLICATION

This application claims priority to Korean Patent Application No. 10-2023-0084527, filed on Jun. 29, 2023, in the Korean Intellectual Property Office, the disclosure of which is incorporated by reference herein in its entirety.

BACKGROUND

The present disclosure relates to a semiconductor package, and more particularly, to a semiconductor package including a redistribution substrate located below a semiconductor chip, and a manufacturing method thereof.

Electronic apparatuses are becoming more compact and lightweight according to rapid development of electronic industries and demand by users. As the electronic apparatuses become smaller and lighter, semiconductor packages used therein are also smaller and lighter. In addition, there is a demand for high reliability along with high performance and large capacity are required for the semiconductor packages. As performance and capacity increase, power consumption of the semiconductor packages also increases. Accordingly, the importance of heat dissipation characteristics of the semiconductor packages corresponding to the size/performance of the semiconductor packages is increasing.

SUMMARY

One or more example embodiments provide a semiconductor package, which minimizes the total thickness of the semiconductor package and maximizes heat dissipation characteristics, and a manufacturing method thereof.

Also, the objects of the inventive concept are not limited to the aforementioned object, but other objects not described herein will be clearly understood by those skilled in the art from the following description.

According to an aspect of an example embodiment, a semiconductor package includes: a redistribution substrate; a first semiconductor chip provided on a right portion, in a first direction, of the redistribution substrate; a through-post provided on the redistribution substrate in a region adjacent to a left side, in the first direction, of the first semiconductor chip; a heat dissipation chip provided on the first semiconductor chip; and a second semiconductor device provided adjacent to the heat dissipation chip on the through-post. A metal pad and an adhesive layer are provided between the heat dissipation chip and the first semiconductor chip.

According to another aspect of an example embodiment, a semiconductor package includes: a redistribution substrate including a plurality of wiring lines in a plurality of layers; a first semiconductor chip provided on a right portion, in a first direction, of the redistribution substrate through a first bump; a through-post provided on the redistribution substrate in a region adjacent to a left side, in the first direction, of the first semiconductor chip; a sealing material provided on the redistribution substrate, surrounding the first semiconductor chip and the through-post, and exposing upper surfaces of the first semiconductor chip and the through-post; a heat dissipation chip provided on the first semiconductor chip, wherein a metal pad and an adhesive layer are provided between the heat dissipation chip and the first semiconductor chip; and a second semiconductor chip provided adjacent to the heat dissipation chip on the through-post, wherein a second bump is provided between the through-post and the second semiconductor chip.

According to another aspect of an example embodiment, a semiconductor package includes: semiconductor package including: a redistribution substrate having a lower surface, on which an external connection terminal is provided, and including a plurality of wiring lines in a plurality of layers; a first semiconductor chip provided on a right portion, in a first direction, of the redistribution substrate through a first bump; a plurality of through-posts provided on the redistribution substrate in a region adjacent to a left side, in the first direction, of the first semiconductor chip and in regions on opposite sides, in a second direction perpendicular to the first direction, of the first semiconductor chip; a sealing material provided on the redistribution substrate, covering side surfaces of the first semiconductor chip and the plurality of through-posts, and exposing upper surfaces of the first semiconductor chip and the plurality of through-posts; a heat dissipation chip provided on the first semiconductor chip through a metal pad and an adhesive layer; and a second semiconductor chip provided adjacent to the heat dissipation chip on the plurality of through-posts through a second bump.

According to another aspect of an example embodiment, a method of manufacturing a semiconductor package, includes: forming alignment metal pads and a plurality of through-posts on a first carrier substrate; stacking a first semiconductor chip on the alignment metal pads such that an active surface of the first semiconductor chip faces the first carrier substrate; forming a sealing material that surrounds the plurality of through-posts and the first semiconductor chip; bonding a second carrier substrate to the plurality of through-posts and a non-active surface of the first semiconductor chip and removing the first carrier substrate; grinding the sealing material to expose first surfaces of the plurality of through-posts and first bumps of the first semiconductor chip; forming a redistribution substrate on the first surfaces of the plurality of through-posts and the first bumps of the first semiconductor chip; bonding the redistribution substrate to a film ring mount and removing the second carrier substrate; stacking a second semiconductor chip on second surfaces of the plurality of through-posts opposite to the first surfaces; and stacking a heat dissipation chip on the non-active surface of the first semiconductor chip, through a metal pad and an adhesive layer, in a region adjacent to the second semiconductor chip.

BRIEF DESCRIPTION OF DRAWINGS

The above and other aspects and features will be more apparent from the following description of example embodiments, taken in conjunction with the accompanying drawings, in which.

DETAILED DESCRIPTION

Figure 1A:
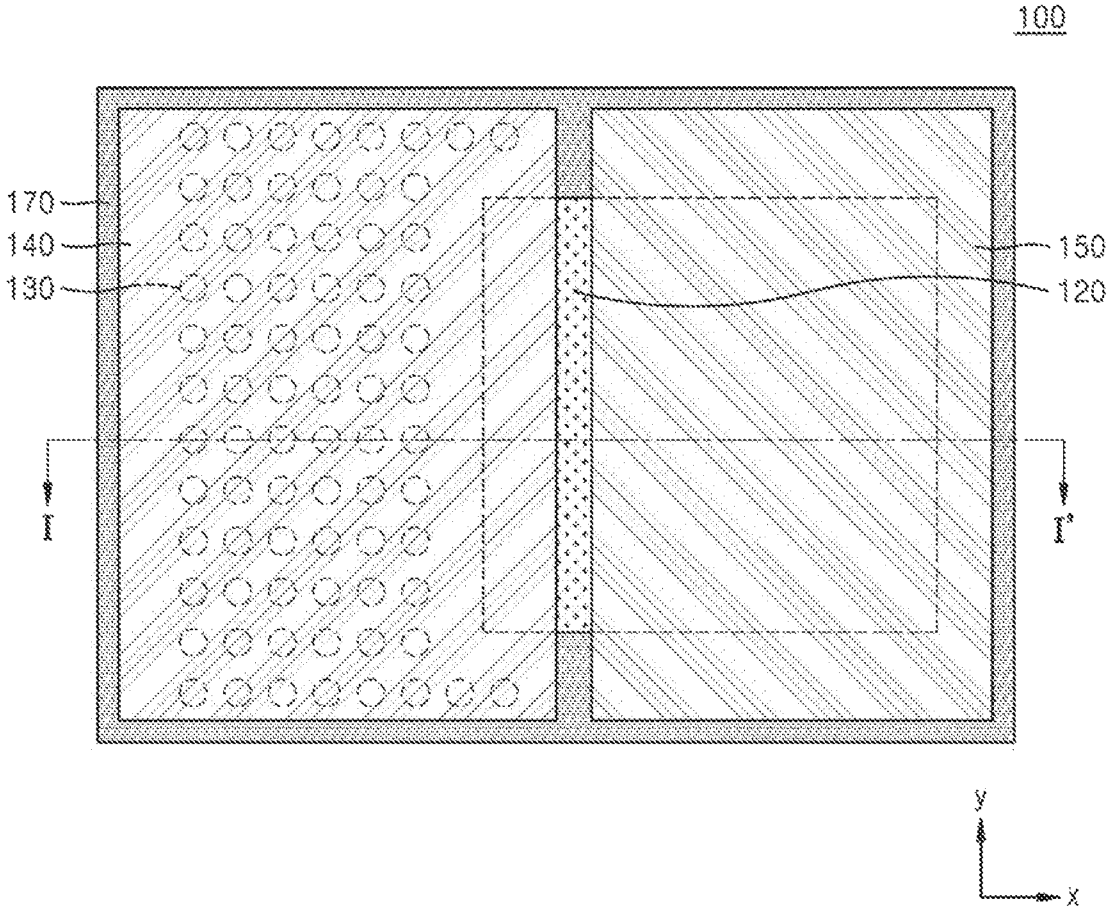
FIGS. 1A, 1B and IC are a plan view and cross-sectional views of a semiconductor package according to an example embodiment.

Hereinafter, example embodiments are described in detail with reference to the accompanying drawings. Embodiments described herein are example embodiments, and thus, the present disclosure is not limited thereto, and may be realized in various other forms. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be also understood that, even if a certain step or operation of manufacturing an apparatus or structure is described later than another step or operation, the step or operation may be performed later than the other step or operation unless the other step or operation is described as being performed after the step or operation. The same reference numerals are given to the same elements in the drawings, and repeated descriptions thereof are omitted.

Figure 1B:
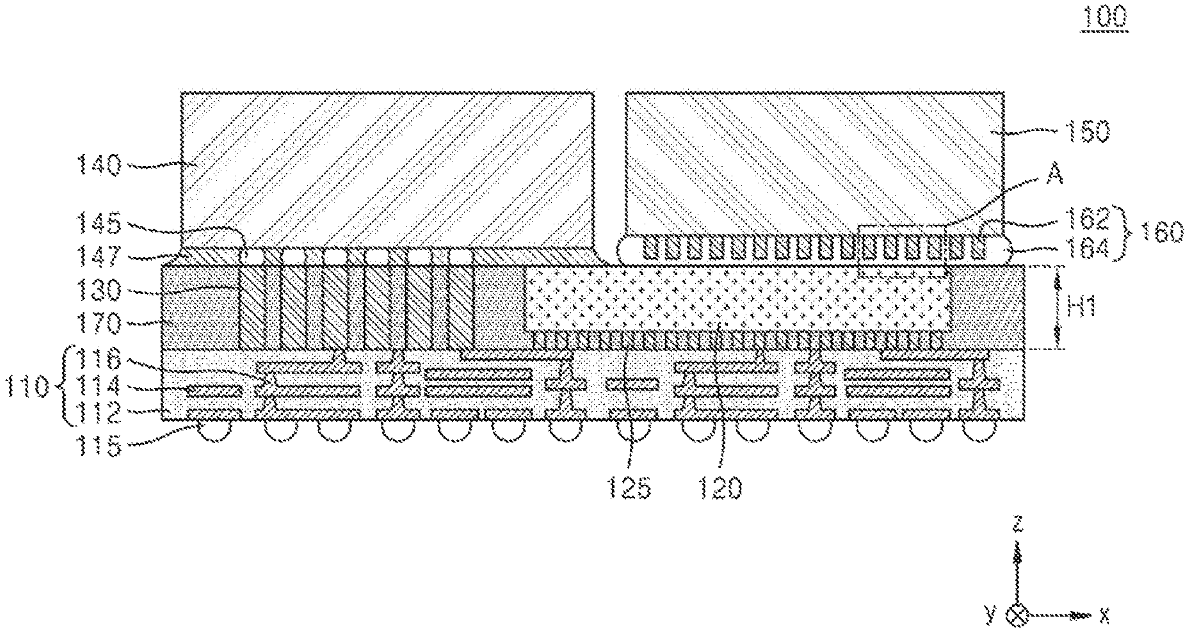
Figure 1C:
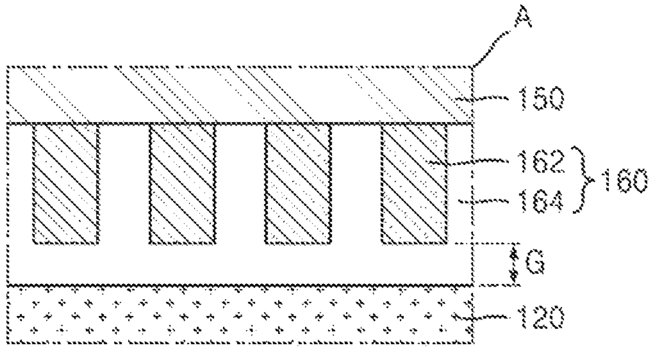

FIGS. 1A to 1C are a plan view and cross-sectional views of a semiconductor package 100 according to an example embodiment. FIG. 1B is a cross-sectional view of the semiconductor package 100 taken along line I-I', and FIG. 1C is an enlarged cross-sectional view of region A of FIG. 1B.

Referring to FIGS. 1A to 1C, the semiconductor package 100 according to an example embodiment may include a redistribution substrate 110, a first semiconductor chip 120, a through-post 130, a second semiconductor chip 140, a heat dissipation chip 150, a heat dissipation connector 160, and a sealing material 170.

The redistribution substrate 110 may be located below the first semiconductor chip 120, the through-post 130, and the sealing material 170. The redistribution substrate 110 may redistribute connections of chip pads of the first semiconductor chip 120 to an external region of the first semiconductor chip 120. The redistribution substrate 110 may include a body insulation layer 112, a redistribution line 114, and a via 116.

The body insulation layer 112 may include an insulating material, for example, photo imageable dielectric (PID) or photo imageable polyimide (PIP) resin and may further include an inorganic filler. However, the material of the body insulation layer 112 is not limited to the materials described above. For example, the body insulation layer 112 may include polyimide isoindro quirazorindione (PIQ), polyimide (PI), polybenzoxazole (PBO), and the like.

The body insulation layer 112 may have a multi-layer structure according to a multi-layer structure of the redistribution line 114. However, for convenience, the body insulation layer 112 is illustrated as a single-layer structure in FIG. 1B. Also, when the body insulation layer 112 has a multi-layer structure, all layers of the body insulation layer 112 may include the same material, or at least one layer of the body insulation layer 112 may include a different material.

The redistribution line 114 may include layers arranged inside the body insulation layer 112. Redistribution lines 114 on different layers may be connected to each other by vias 116. The redistribution line 114 and the via 116 may include, for example, copper (Cu). However, the materials of the redistribution line 114 and the via 116 are not limited to Cu.

An external connection terminal 115 may be disposed on the lower surface of the body insulation layer 112. The external connection terminal 115 may be disposed on an external connection pad formed on the lower surface of the body insulation layer 112. The external connection pad may be included as a part of the redistribution line 114. However, in some example embodiments, the external connection pad may be regarded as a separate component from the redistribution line 114.

The external connection terminal 115 may be electrically connected to the redistribution line 114 through the external connection pad. Accordingly, the external connection terminal 115 may be electrically connected to the first semiconductor chip 120 through the redistribution line 114 of the redistribution substrate 110 and a first bump 125. In addition, the external connection terminal 115 may connect the semiconductor package 100 to a package substrate of an external system or a main board of an electronic device such as a mobile device. The external connection terminal 115 may include a conductive material, for example, at least one of tin (Sn), silver (Ag), copper (Cu), and aluminum (Al). However, the material of the external connection terminal 115 is not limited to the materials described above.

External connection terminals 115 may be arranged on a first lower surface of the redistribution substrate 110 corresponding to the lower surface of the first semiconductor chip 120 and a second lower surface of the redistribution substrate 110 extending outward in an x direction from the first lower surface of the redistribution substrate 110. As described above, a package structure in which the external connection terminals 115 are arranged in a wider region than the lower surface of the first semiconductor chip 120 is referred to as a fan-out (FO) package structure. On the other hand, a package structure in which the external connection terminals 115 are arranged only in a region corresponding to the lower surface of the first semiconductor chip 120 is referred to as a fan-in (FI) package structure.

The first semiconductor chip 120 may be mounted on the redistribution substrate 110 through the first bump 125. The first bump 125 may include a metal pillar. In some example embodiments, the first bump 125 may include a metal pillar and solder. Here, the metal pillar may include, for example, Cu. However, the material of the metal pillar is not limited to Cu.

The first semiconductor chip 120 may be disposed on the redistribution substrate 110 while being biased (i.e., offset from a center) to on one side in the x direction. For example, as illustrated in FIG. 1B, the first semiconductor chip 120 may be disposed on the redistribution substrate 110 while being biased to the right in the x direction. Also, as the first semiconductor chip 120 is biased to the right in the x direction, the heat dissipation chip 150 above the first semiconductor chip 120 may also be biased to the right. This arrangement structure may allow heat generated from the first semiconductor chip 120 to be effectively dissipated.

The first semiconductor chip 120 may include an analog chip. The first semiconductor chip 120 may include a plurality of logic elements therein. Here, a logic element may refer to an element that performs various signal processing and may include, for example, an AND gate, an OR gate, a NOT gate, and a flip-flop. The logic element may also include elements for supporting communication. In the semiconductor package 100, the first semiconductor chip 120 may include, for example, an application processor (AP) chip. Depending on functions, the first semiconductor chip 120 may also be referred to as a control chip, a process chip, a central processing unit (CPU) chip, or the like. Also, in terms of integrated functions, the first semiconductor chip 120 is also referred to as a System on Chip (SoC). Also, according to example embodiments, elements for supporting communication may be separately provided as another chip, for example, a modem chip, and may be disposed on the redistribution substrate 110 in the form of a structure coupled to the first semiconductor chip 120. An example embodiment of a semiconductor package having such a structure is described below in more detail in the description of FIGS. 4A and 4B.

The first semiconductor chip 120 may include a substrate and a multi-wiring layer. Also, an integrated circuit layer may be formed on an active surface of the substrate. The integrated circuit layer may include a plurality of logic elements. The multi-wiring layer may be disposed on the lower surface of the substrate and include multi-layer wires. In the first semiconductor chip 120, the lower surface thereof may be a front surface, which is an active surface, and the upper surface thereof may be a back surface, which is a non-active surface. In this regard, the lower surface of the substrate, on which the multi-wiring layer is disposed, may correspond to the front surface of the first semiconductor chip 120, and the upper surface of the substrate may correspond to the back surface of the first semiconductor chip 120.

The through-post 130 may be located between the redistribution substrate 110 and the second semiconductor chip 140. Also, the sealing material 170 may be located between the redistribution substrate 110 and the second semiconductor chip 140. Accordingly, the through-post 130 may have a structure extending through the sealing material 170. The through-post 130 may electrically connect the redistribution substrate 110 and the second semiconductor chip 140 to each other. For example, the lower surface of the through-post 130 may be connected to the redistribution line 114 of the redistribution substrate 110 and the upper surface of the through-post 130 may be connected to the second semiconductor chip 140 through a second bump 145.

The through-post 130 may include, for example, Cu. Accordingly, the through-post 130 may be referred to as a Cu post. However, the material of the through-post 130 is not limited to Cu. The through-post 130 may be formed through an electroplating process using a seed metal. The seed metal may include, for example, various metal materials, such as Cu, titanium (Ti), tantalum (Ta), titanium nitride (TiN), and tantalum nitride (TaN). In the semiconductor package 100, the seed metal may be included as a part of the through-post 130. For example, the seed metal may include Cu, and the through-post 130 may also include Cu.

The second semiconductor chip 140 may be provided adjacent to the heat dissipation chip 150 and mounted on the through-post 130. The second semiconductor chip 140 may include a memory chip. Accordingly, the second semiconductor chip 140 may include a plurality of memory elements therein. The second semiconductor chip 140 may include, for example, a volatile memory element, such as dynamic random access memory (DRAM) or static random access memory (SRAM), or a non-volatile memory element, such as flash memory. In the semiconductor package 100, the second semiconductor chip 140 may include, for example, a DRAM element.

Also, in some example embodiments, instead of the second semiconductor chip 140, a memory element having a package structure in which a plurality of memory chips are stacked may be stacked on the through-post 130. As described above, when the memory elements of the package structure are stacked on the through-post 130, the entire semiconductor package may correspond to a package on package (POP) structure. The semiconductor package having the POP structure is described below in more detail in the description of FIG. 3.

The second semiconductor chip 140 may be mounted on the through-post 130 through second bumps 145 in a flip-chip bonding structure. For example, the second bumps 145 may be respectively located between chip pads of the second semiconductor chip 140 and upper surfaces of corresponding through-posts 130. According to example embodiments, post pads may be formed on the through-posts 130, and the second bump 145 may be located between the chip pad and a corresponding post pad. Also, an underfill 147 may fill a space between the second semiconductor chip 140 and the sealing material 170 and a space between second bumps 145. According to an example embodiment, the underfill 147 may be omitted.

The heat dissipation chip 150 may be provided adjacent to the second semiconductor chip 140 and stacked on the first semiconductor chip 120. The heat dissipation chip 150 may be stacked on the first semiconductor chip 120 through the heat dissipation connector 160. The heat dissipation chip 150 may include, for example, a silicon (Si) chip. Elements or wires may not be formed inside the heat dissipation chip 150. In general, the thermal conductivity of Si may be higher than that of a resin constituting the sealing material 170, such as an epoxy molding compound (EMC). Accordingly, the heat dissipation chip 150 may contribute to efficiently dissipating heat generated from the first semiconductor chip 120.

The heat dissipation connector 160 may include metal pads 162 and an adhesive layer 164. Each of the metal pads 162 may be disposed on the lower surface of the heat dissipation chip 150 and have a metal having high thermal conductivity. For example, the metal pad 162 may include copper (Cu), nickel (Ni), aluminum (Al), tin (Sn), gold (Au), silver (Ag), or the like. However, the material of the metal pad 162 is not limited to the metals described above. Also, according to an example embodiment, a passivation layer may be provided on the lower surface of the heat dissipation chip 150, and the metal pad 162 may be disposed on the lower surface of the heat dissipation chip 150 in a form passing through the passivation layer. The passivation layer may include, for example, a silicon oxide material or a silicon nitride material.

The adhesive layer 164 may adhere and fix the heat dissipation chip 150 on the first semiconductor chip 120. As illustrated in FIG. 1B, the adhesive layer 164 may cover the metal pads 162 on the lower surface of the heat dissipation chip 150 and slightly protrude from a side surface of the heat dissipation chip 150. Also, the adhesive layer 164 may include a material having high thermal conductivity in order to efficiently transfer heat from the first semiconductor chip 120 to the metal pad 162 and the heat dissipation chip 150. For example, the adhesive layer 164 may include a thermal interface material (TIM), thermally conductive resin, thermally conductive polymer, or silicon oxide or silicon nitride such as $SiO_2$ or SiCN. Here, the TIM may include a material having high thermal conductivity, that is, a material having low thermal resistance, such as grease, tape, an elastomer filling pad, a phase change material, and the like.

As illustrated in FIG. 1C, a gap G may be maintained between the first semiconductor chip 120 and the metal pad 162. That is, the gap G may exist between the lower surface of the metal pad 162 and the upper surface of the first semiconductor chip 120, and the adhesive layer 164 may be provided in the gap G. In the semiconductor package 100, the gap G may be, for example, 1 μm or less. As described above, the gap G is maintained between the metal pads 162 and the first semiconductor chip 120, and the adhesive layer 164 is provided in the gap G. Therefore, warpage may be prevented by relieving stress caused by the difference in thermal expansion coefficients between the metal pads 162 and the first semiconductor chip 120. Also, according to an example embodiment, when warpage is not a critical consideration, the lower surface of the metal pad 162 may be in contact with the upper surface of the first semiconductor chip 120.

For reference, in the case of a related semiconductor package, a sealing material surrounds upper and side surfaces of the first semiconductor chip, and a redistribution substrate is located above the first semiconductor chip. Also, the related semiconductor package may have a structure in which an upper package is provided above the first semiconductor chip through an inter-substrate connection terminal. In the case of this structure, because the first semiconductor chip is covered with the sealing material having low thermal conductivity, heat dissipation efficiency may be seriously deteriorated. However, in the semiconductor package 100 according to an embodiment, the upper surface of the first semiconductor chip 120 is exposed and the heat dissipation chip 150 having Si is stacked on the first semiconductor chip 120 through the heat dissipation connector 160. Accordingly, heat dissipation efficiency may be significantly improved.

The sealing material 170 may be located between the redistribution substrate 110 and the second semiconductor chip 140 and between the redistribution substrate 110 and the heat dissipation chip 150. The sealing material 170 may cover side surfaces of the first semiconductor chip 120 and seal the same. Also, the sealing material 170 may cover side surfaces of the through-posts 130. In addition, as illustrated in FIG. 1B, the sealing material 170 may fill a space between the redistribution substrate 110 and the first semiconductor chip 120 and spaces between first bumps 125 on the lower surface of the first semiconductor chip 120. However, in some example embodiments, an underfill may fill spaces between the first bumps 125 on the lower surface of the first semiconductor chip 120, and the sealing material 170 may cover side surfaces of the first semiconductor chip 120 and the underfill.

The sealing material 170 may include an insulating material, for example, a thermosetting resin such as epoxy resin, a thermoplastic resin such as polyimide, or a resin formed by providing the thermosetting or thermoplastic resin with a reinforcing material such as an inorganic filler. For example, the sealing material 170 may include Ajinomoto Build-up Film (ABF), FR-4, a Bismaleimide Triazine (BT) resin. In addition, the sealing material 170 may include a molding material such as EMC or a photosensitive material such as a photo imageable encapsulant (PIE). However, the material of the sealing material 170 is not limited to the materials described above.

As shown in FIG. 1B, the sealing material 170 may seal the first semiconductor chip 120 through a structure exposing the upper surface of the first semiconductor chip 120. As described above, because the sealing material 170 has the structure exposing the upper surface of the first semiconductor chip 120, the thickness of the sealing material 170 may be minimized. For example, the sealing material 170 has a first thickness H1, and the first thickness H1 may be 100 μm or less. However, the thickness of the sealing material 170 is not limited to the aforementioned numerical range. As described above, the sealing material 170 has a small thickness of 100 μm or less, and thus, the warpage may be easily controlled. For example, as the sealing material 170 becomes thinner, stress due to the difference in thermal expansion coefficients between the sealing material 170 and the first semiconductor chip 120 may decrease. Accordingly, the warpage may be reduced. Also, as the sealing material 170 has a small thickness, the total thickness of the semiconductor package 100 may be reduced by the amount of reduced thickness of the sealing material 170.

Referring to FIG. 1A, with respect to planar sizes and positional relationships between the redistribution substrate 110 and the first semiconductor chips 120, the second semiconductor chip 140, and the heat dissipation chip 150, the redistribution substrate 110 may have substantially the same size as the sealing material 170 in a plan view. Accordingly, the first semiconductor chip 120 and the through-posts 130 may be arranged within the redistribution substrate 110 in a plan view. In addition, the second semiconductor chip 140 and the heat dissipation chip 150, which are respectively provided above the first semiconductor chip 120 and the through-posts 130, may also be arranged within the redistribution substrate 110 in a plan view. Also, most of the first semiconductor chip 120 may overlap the heat dissipation chip 150, and only a portion of the first semiconductor chip 120 may overlap the second semiconductor chip 140. For example, the portion of the first semiconductor chip 120 that overlaps the second semiconductor chip 140 may be less than a portion of the first semiconductor chip 120 that does not overlap the second semiconductor chip 140.

In the semiconductor package 100, the heat dissipation chip 150 is disposed on the upper surface of the first semiconductor chip 120, which includes the SoC, through the heat dissipation connector 160, and thus, it is possible to maximize the heat dissipation effect of the first semiconductor chip 120. Also, in the semiconductor package 100, the sealing material 170 has a small thickness of 100 μm or less, and thus, it is possible to easily control the warpage and reduce the total thickness of the semiconductor package. Here, signal exchange between the first semiconductor chip 120 and the second semiconductor chip 140 may be performed through the second bumps 145, the through-posts 130, the redistribution lines 114 of the redistribution substrate 110, and the first bumps 125. In the semiconductor package 100, the thickness of the sealing material 170 is reduced, and thus, the length of the through-post 130 may also be reduced. Accordingly, a signal exchange path between the first semiconductor chip 120 and the second semiconductor chip 140 may be shortened.

In the semiconductor package 100, the first semiconductor chip 120 may be self-aligned and disposed on the redistribution substrate 110. Accordingly, the redistribution lines 114 in the redistribution substrate 110 may be designed to have a fine line & space (L/S). For example, among the redistribution lines 114 of the redistribution substrate 110 in the semiconductor package 100, the uppermost redistribution line 114 connected to the first bump 125 of the first semiconductor chip 120 may have a line width and space of about 2/2 μm. In addition, the redistribution lines 114 below the uppermost redistribution line 114 may have a line width and space of, for example, about 7/8 μm. The self-aligned arrangement of the first semiconductor chip 120 is described below in more detail in the description of a semiconductor package manufacturing method of FIGS. 8A to 10G.

Figure 2:
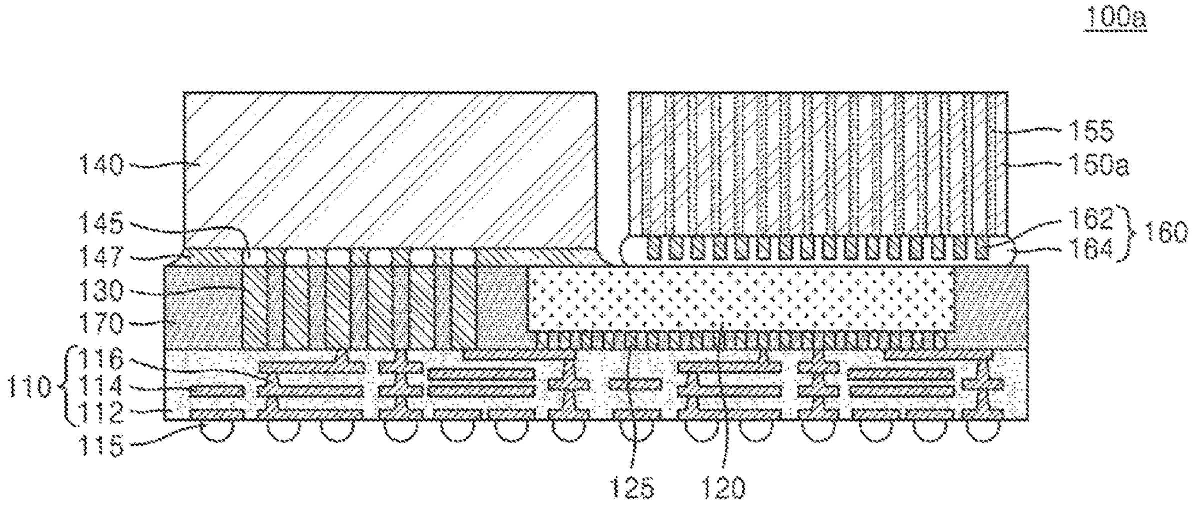
FIG. 2 is a cross-sectional view of a semiconductor package according to an example embodiment.

FIG. 2 is a cross-sectional view of a semiconductor package 100*a* according to an example embodiment. The descriptions already given with reference to FIGS. 1A to 1C are briefly given or omitted.

Referring to FIG. 2, the semiconductor package 100*a* may be different from the semiconductor package 100 of FIG. 1B in terms of a structure of a heat dissipation chip 150*a*. Specifically, in the semiconductor package 100*a*, a plurality of metal lines 155 may be arranged inside the heat dissipation chip 150*a*. The metal lines 155 may include, for example, through-vias that pass through the heat dissipation chip 150*a* in a vertical direction. Each of the metal lines 155 may include a metal having high thermal conductivity. For example, the metal line 155 may include Cu, Ni, Al, Sn, Au, Ag, or the like. However, the material of the metal line 155 is not limited to the metals described above.

The metal line 155 has higher thermal conductivity than Si of the heat dissipation chip 150*a* and thus may contribute to dissipating heat from the first semiconductor chip 120 more efficiently. The metal lines 155 may be connected to the metal pads 162 located below the heat dissipation chip 150*a*. However, at least some of the metal lines 155 may not be connected to the metal pads 162.

Figure 3:
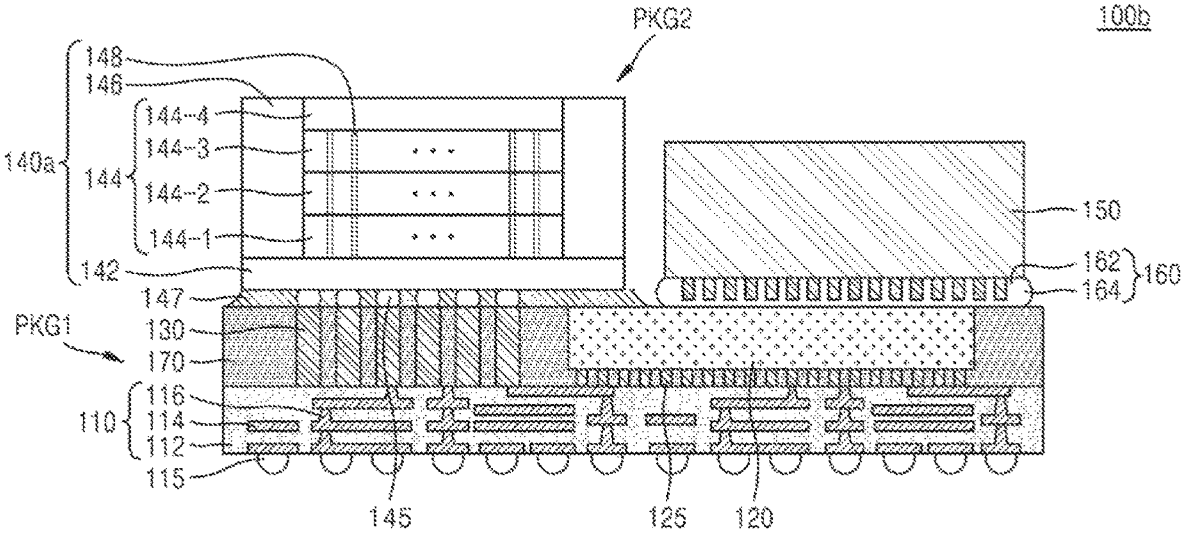
FIG. 3 is a cross-sectional view of a semiconductor package according to an example embodiment.

FIG. 3 is a cross-sectional view of a semiconductor package 100*b* according to an example embodiment. The descriptions already given with reference to FIGS. 1A to 2 are briefly given or omitted.

Referring to FIG. 3, the semiconductor package 100*b* may be different from the semiconductor package 100 of FIG. 1B in that a memory element 140*a* having a package structure instead of a second semiconductor chip is stacked on the through-posts 130. In the semiconductor package 100*b*, the memory element 140*a* may include a high bandwidth memory (HBM) package. More specifically, the memory element 140*a* including an HBM package may include a base chip 142 and a plurality of core chips 144 on the base chip 142.

The base chip 142 and the core chips 144 may include through-electrodes 148 inside the base chip 142 and the core chips 144. Here, a through-electrode 148 may include a through-silicon via (TSV). As shown in FIG. 3, an uppermost core chip 144-4 among the core chips 144 may not include the through-electrode 148. Here, fine bumps and an adhesive layer may be arranged between the base chip 142 and the core chip 144 and between the adjacent core chips 144. Also, the fine bumps may be connected to the through-electrodes 148.

The base chip 142 may include logic elements. Therefore, the base chip 142 may include a logic chip. The base chip 142 may be located below the core chips 144 to integrate and transmit signals of the core chips 144 to the outside (i.e., to external components or devices) and to transmit signals and power from the outside to the core chips 144. Accordingly, the base chip 142 may be referred to as a buffer chip or a control chip. Also, each of the core chips 144 may include a memory chip. For example, each of the core chips 144 may include a DRAM chip. Here, a core chip 144 may be stacked on the base chip 142 or a lower core chip 144, through pad-to-pad bonding, hybrid bonding (HB), bonding using a bonding member, or bonding using an anisotropic conductive film (ACF), or the like. In FIG. 3, four core chips 144 are stacked on the base chip 142, but the number of core chips 144 is not limited to four. For example, three or less core chips 144 or five or more core chips 144 may be stacked on the base chip 142.

The memory element 140*a* may be mounted on the through-posts 130 through the second bumps 145. More specifically, the second bumps 145 may be arranged between the lower surface of the base chip 142 and the through-posts 130. Chip pads may be arranged on the lower surface of the base chip 142, and the second bumps 145 may be arranged on the chip pads. Also, according to example embodiments, post pads may be formed on the through-posts 130, and the second bump 145 may be located between the chip pad and a corresponding post pad The core chips 144 on the base chip 142 may be sealed by an inner sealing material 146. For example, lateral surfaces of the core chips 144 may be covered by the inner sealing material 146. An upper surface of the uppermost core chip 144-4 among the core chips 144 may not be covered by the inner sealing material 146. However, in some example embodiments, the upper surface of the uppermost core chip 144-4 may be covered by the inner sealing material 146.

In the semiconductor package 100*b*, the memory element 140*a* is not limited to an HBM package. For example, the memory element 140*a* may have a general package structure. For example, the memory element 140*a* may include an upper package substrate and a plurality of memory chips stacked on the upper package substrate. The upper package substrate may be stacked on the through-posts 130 through the second bumps 145. Also, the memory chips may be stacked on the upper package substrate through bonding wires or may be stacked on the upper package substrate through bumps and TSVs.

The semiconductor package 100*b* may have a POP structure. Specifically, the redistribution substrate 110, the first semiconductor chip 120, the through-posts 130, and the sealing material 170 may constitute a first package PKG1, and the memory element 140*a* may constitute a second package PKG2. Accordingly, the semiconductor package 100*b* may have a POP structure in which the second package PKG2 is stacked on the first package PKG1 through the second bumps 145.

Figure 4A:
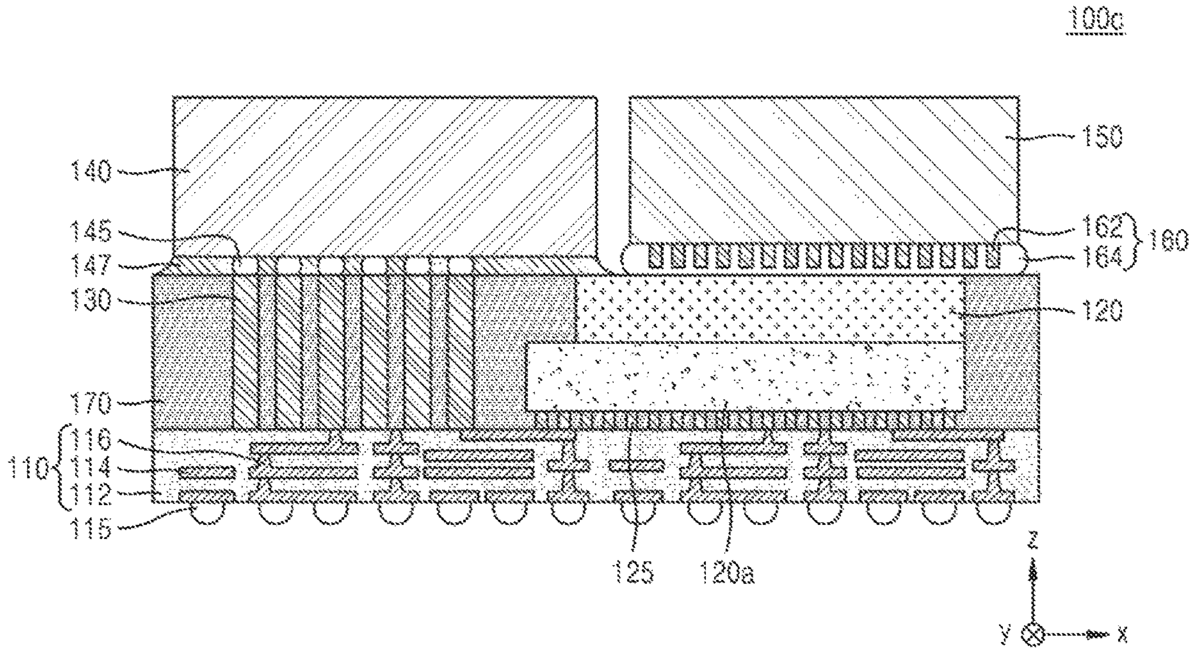
FIGS. 4A and 4B are cross-sectional views of a semiconductor package according to an example embodiment.
Figure 4B:
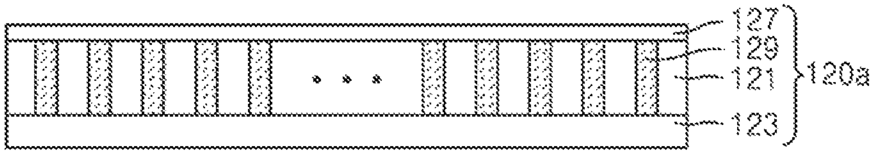

FIGS. 4A and 4B are cross-sectional views of a semiconductor package 100*c* according to an example embodiment, and FIG. 4B is a cross-sectional view showing a third semiconductor chip 120*a* in the semiconductor package 100*c* of FIG. 4A in more detail. The descriptions already given with reference to FIGS. 1A to 3 are briefly given or omitted.

Referring to FIGS. 4A and 4B, the semiconductor package 100*c* according to an example embodiment may be different from the semiconductor package 100 of FIG. 1B in that the semiconductor package 100*c* further includes a third semiconductor chip 120*a* located below the first semiconductor chip 120. For example, the third semiconductor chip 120*a* may include a modem chip for supporting communication of the first semiconductor chip 120. However, the type of the third semiconductor chip 120*a* is not limited to a modem chip. For example, the third semiconductor chip 120*a* may include various types of integrated elements for supporting the operation of the first semiconductor chip 120. The third semiconductor chip 120*a* may include a multi-channel I/O interface for exchanging memory signals with the second semiconductor chip 140.

As shown in FIG. 4B, the third semiconductor chip 120*a* may include a substrate 121, a lower multi-wiring layer 123, an upper wiring layer 127, and through-electrodes 129. The substrate 121 constitutes a body of the third semiconductor chip 120*a* and may be formed based on Si. An integrated circuit layer may be formed on an active surface of the substrate 121. The integrated circuit layer may include a plurality of logic elements. The lower multi-wiring layer 123 may be disposed on the lower surface of the substrate 121 and include multi-layer wires. Also, chip pads may be arranged on the lower surface of the lower multi-wiring layer 123, and the first bumps 125 may be arranged on the chip pads.

The upper wiring layer 127 may be disposed above the substrate 121. Wires may be located in the upper wiring layer 127, and the wires may be arranged in the form of a single layer or multiple layers (i.e., multi-layers). In the case of multi-layer wires, wires on different layers may be connected to each other through vias. Upper pads connected to the wires may be arranged on the upper surface of the upper wiring layer 127. According to an example embodiment, the upper wiring layer 127 may be omitted. When the upper wiring layer 127 is omitted, the upper surfaces of the through-electrodes 129 may be exposed through the substrate 121, or electrode pads on the upper surfaces of the through-electrodes 129 may be exposed through the substrate 121.

The through-electrodes 129 may pass through the substrate 121 and connect wires of the upper wiring layer 127 and wires of the lower multi-wiring layer 123 to each other. Because each of the through-electrodes 129 has a structure that passes through silicon constituting the substrate 121, the through-electrode 129 may be referred to as a TSV. For reference, the through-electrodes 129 may be classified as: a via-first structure, which is formed before an integrated circuit layer on the substrate 121 is formed; a via-middle structure, which is formed after formation of an integrated circuit layer and before formation of a multi-wiring layer; and a via-last structure, which is formed after a multi-wiring layer is formed. In FIG. 4B, the through-electrode 129 may correspond to, for example, the via-middle structure.

In the third semiconductor chip 120*a*, the lower surface thereof may be a front surface, which is an active surface, and the upper surface thereof may be a back surface, which is a non-active surface. In this regard, the lower surface of the lower multi-wiring layer 123 may correspond to the front surface of the third semiconductor chip 120*a*, and the upper surface of the upper wiring layer 127 may correspond to the back surface of the third semiconductor chip 120*a*. The chip pads are formed on the front surface of the third semiconductor chip 120*a*, which is an active surface, and the third semiconductor chip 120*a* may be mounted on the redistribution substrate 110 through the first bumps 125 in a flip-chip structure.

Also, the first semiconductor chip 120 may be stacked on the third semiconductor chip 120*a* through bonding using bumps, bonding using ACF, HB, or the like. For reference, HB may refer to bonding in which pad-to-pad bonding and insulator-to-insulator bonding are combined. ACF may refer to an anisotropic conductive film made to conduct electricity in only one direction and may also refer to a conductive film made into a film state by mixing fine conductive particles with an adhesive resin.

Figure 5:
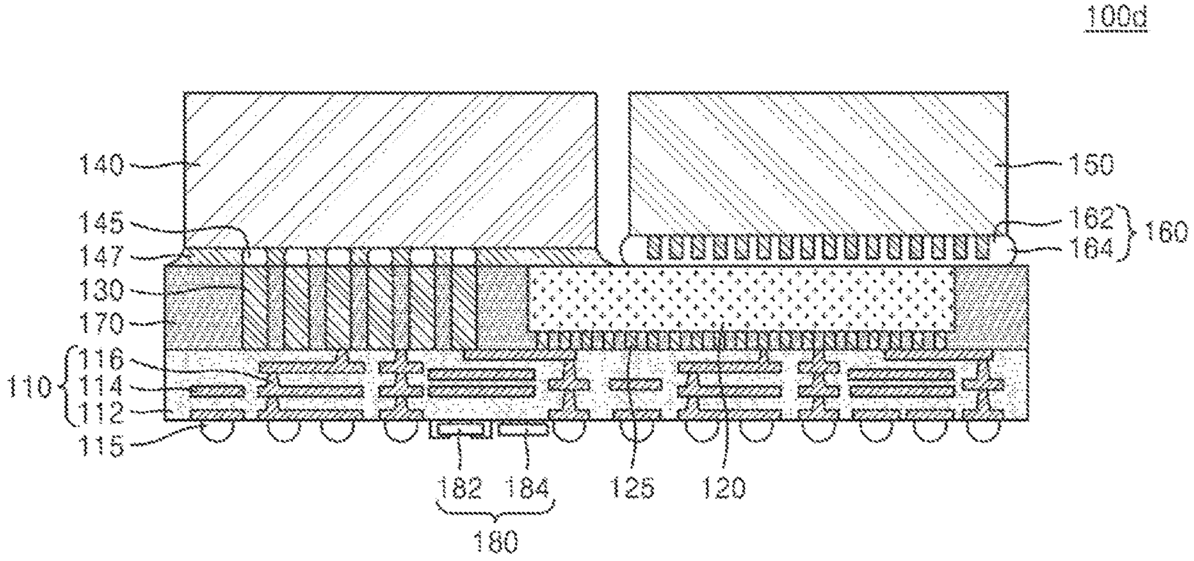
FIG. 5 is a cross-sectional view of a semiconductor package according to an example embodiment.

FIG. 5 is a cross-sectional view of a semiconductor package 100*d* according to an example embodiment. The descriptions already given with reference to FIGS. 1A to 4B are briefly given or omitted.

Referring to FIG. 5, the semiconductor package 100*d* may be different from the semiconductor package 100 of FIG. 1B in that the semiconductor package 100*d* further includes a passive element 180. Specifically, in the semiconductor package 100*d*, the passive element 180 may be located on the lower surface of the redistribution substrate 110. However, according to an example embodiment, the passive element 180 may be disposed on the upper surface of the redistribution substrate 110 or located inside the redistribution substrate 110. The passive element 180 may include a two-terminal element, such as a resistor, an inductor, or a capacitor. For example, the passive element 180 may include a multi-layer ceramic capacitor (MLCC) 182 and a Si-capacitor 184.

Figure 6:
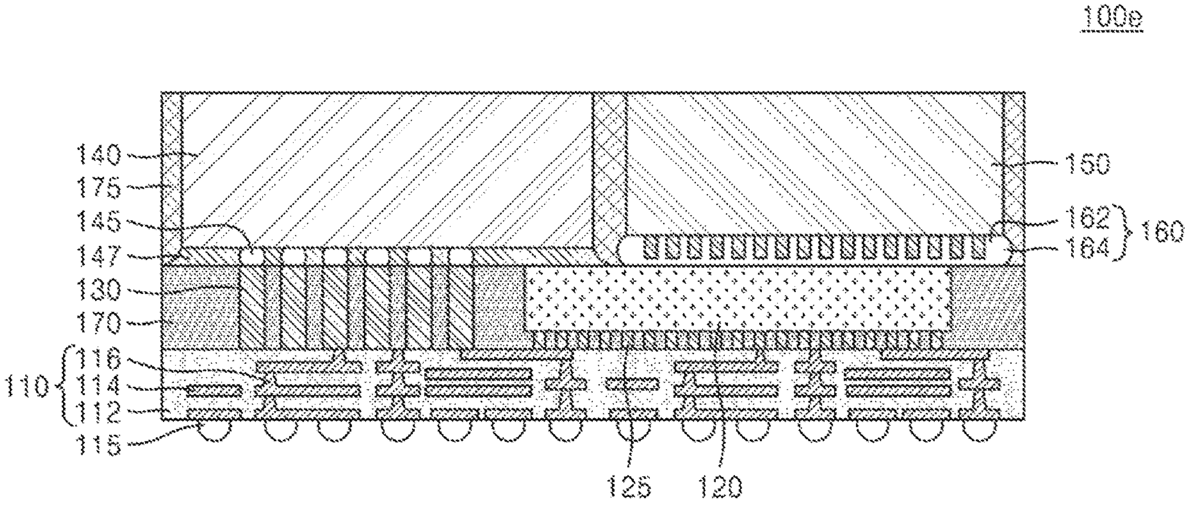
FIG. 6 is a cross-sectional view of a semiconductor package according to an example embodiment.

FIG. 6 is a cross-sectional view of a semiconductor package 100*e* according to an example embodiment. The descriptions already given with reference to FIGS. 1A to 5 are briefly given or omitted.

Referring to FIG. 6, the semiconductor package 100*e* may further include an upper sealing material 175 which is provided above the first semiconductor chip 120, the through-posts 130, and the sealing material 170 to seal the second semiconductor chip 140 and the heat dissipation chip 150. The upper sealing material 175 has the same material and characteristics as the sealing material 170 of the semiconductor package 100 of FIG. 1B. As shown in FIG. 6, the upper sealing material 175 may cover side surfaces of the second semiconductor chip 140 and the underfill 147 and side surfaces of the heat dissipation chip 150 and the heat dissipation connector 160. In some example embodiments, the underfill 147 may be omitted, and the upper sealing material 175 may fill a space between the second semiconductor chip 140 and the sealing material 170 and spaces between the second bumps 145.

Also, the upper sealing material 175 may not cover the upper surfaces of the second semiconductor chip 140 and the heat dissipation chip 150. However, according to an example embodiment, the upper sealing material 175 may cover the upper surface of the second semiconductor chip 140. In this structure, the upper surface of the second semiconductor chip 140 may be lower than the upper surface of the heat dissipation chip 150.

Figure 7:
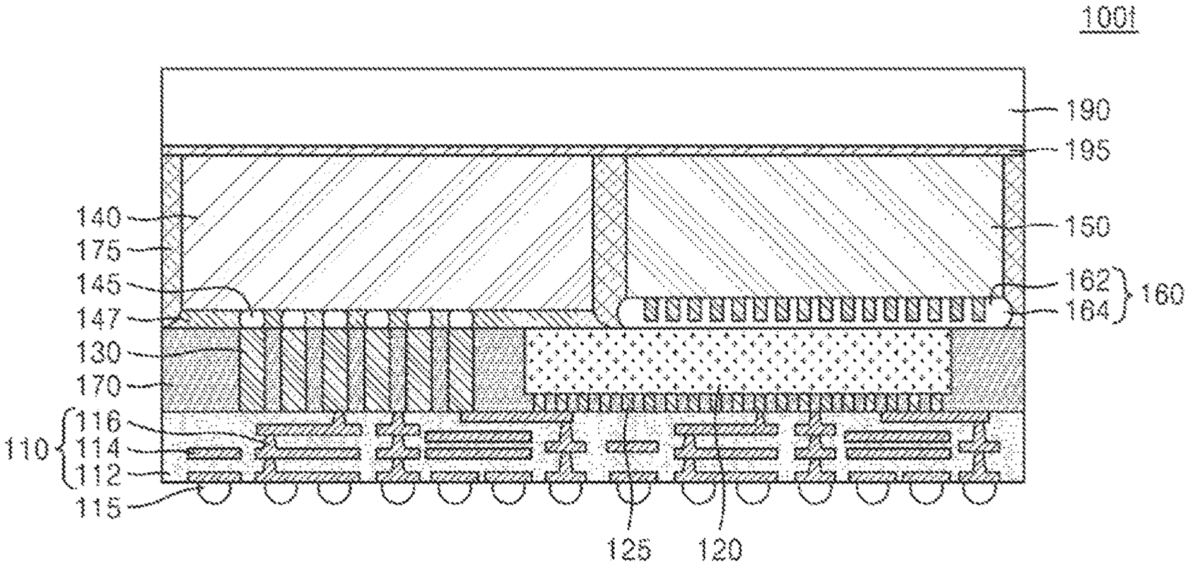
FIG. 7 is a cross-sectional view of a semiconductor package according to an example embodiment.

FIG. 7 is a cross-sectional view of a semiconductor package 100*f* according to an example embodiment. The descriptions already given with reference to FIGS. 1A to 6 are briefly given or omitted.

Referring to FIG. 7, the semiconductor package 100*f* may be different from the semiconductor package 100*e* of FIG. 6 in that the semiconductor package 100*f* further includes a heat dissipation structure 190 on the second semiconductor chip 140 and the heat dissipation chip 150. Also, the heat dissipation structure 190 of the semiconductor package 100*f* is not limited to the semiconductor package 100*e* of FIG. 6, and the heat dissipation structure 190 may be disposed on each of the semiconductor packages 100, 100*a* to 100*d* of FIGS. 1B and 2 to 5.

The heat dissipation structure 190 may include, for example, a heatsink or a heatslug. The heat dissipation structure 190 may be bonded to and stacked on the second semiconductor chip 140 and the heat dissipation chip 150 through an upper adhesive layer 195. The upper adhesive layer 195 may include a material having high thermal conductivity, such as a TIM or a thermally conductive resin.

Figure 8A:
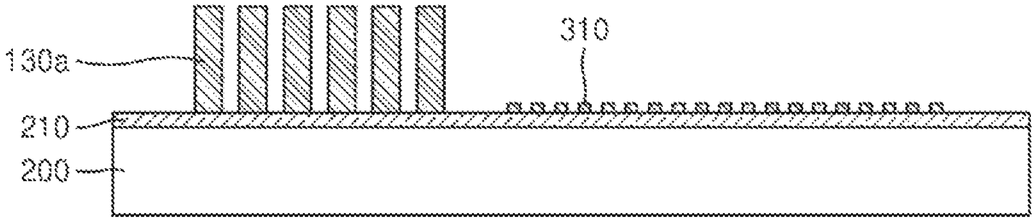
FIGS. 8A, 8B, 8C, 8D, 8E, 8F, 8G, 8H, 8I, 8J and 8K are cross-sectional views schematically illustrating a process of a method of manufacturing the semiconductor package of FIG. 1B according to an example embodiment.
Figure 8B:
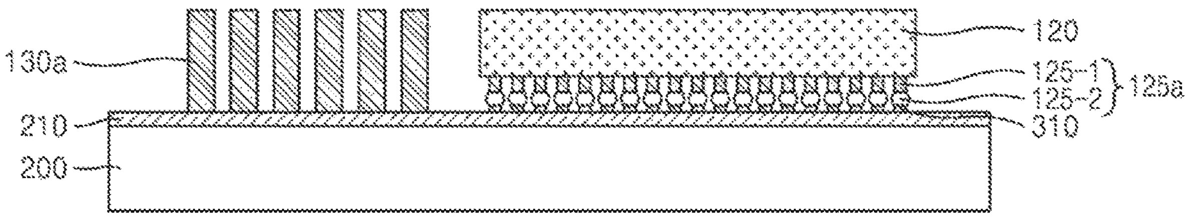
Figure 8C:
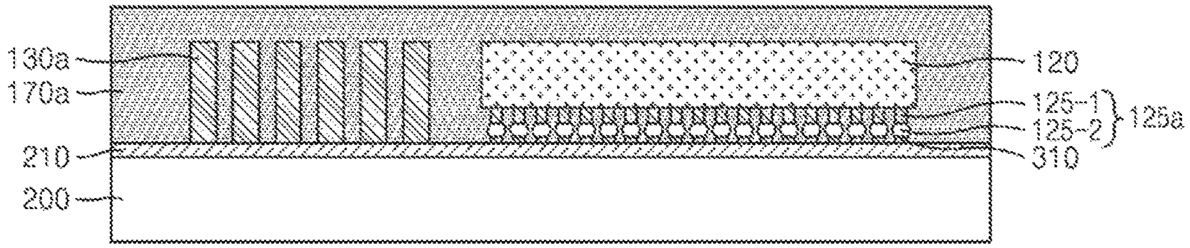
Figure 8D:
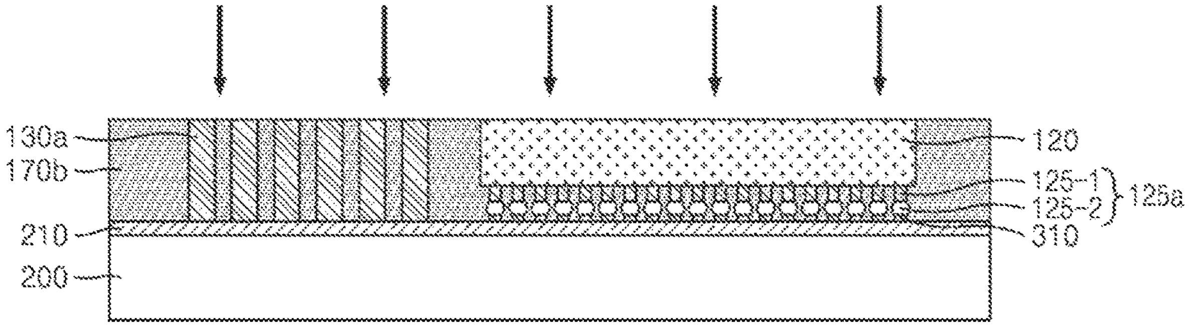
Figure 8E:
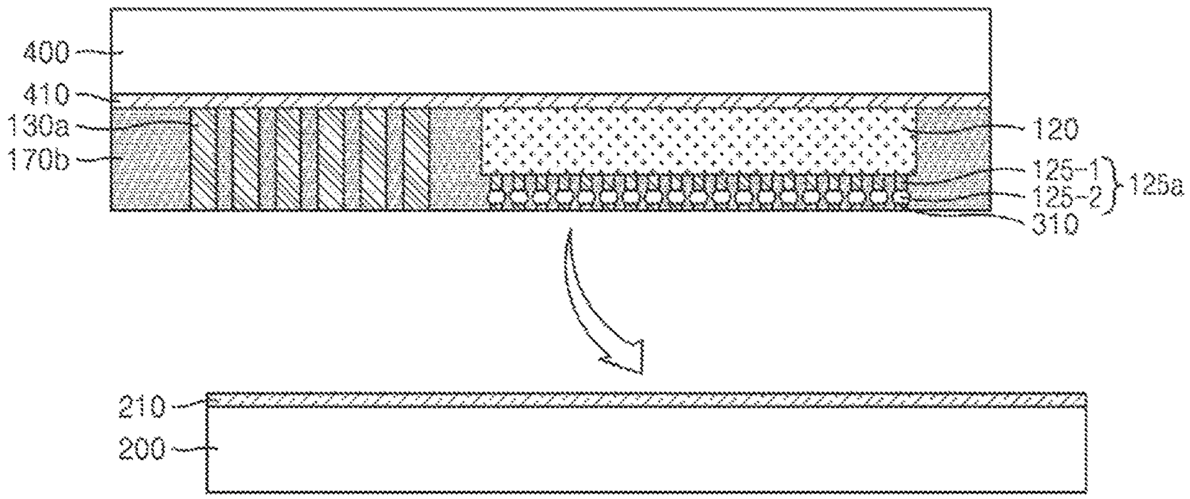
Figure 8F:
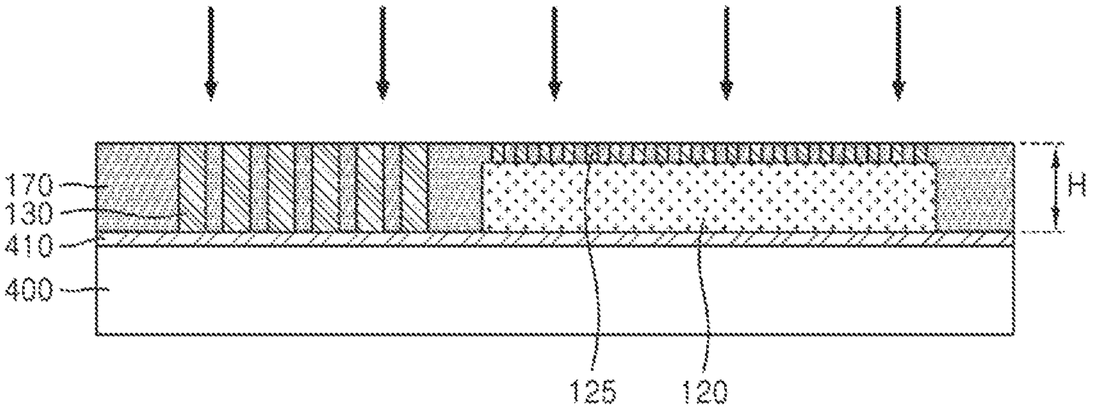
Figure 8G:
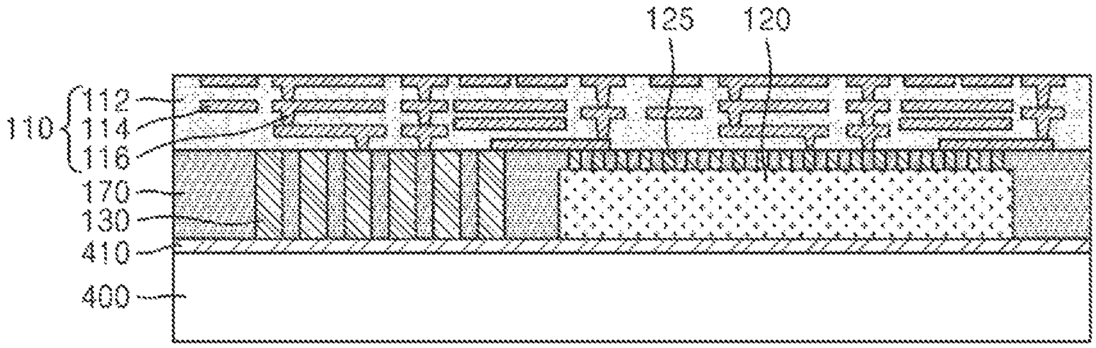
Figure 8H:
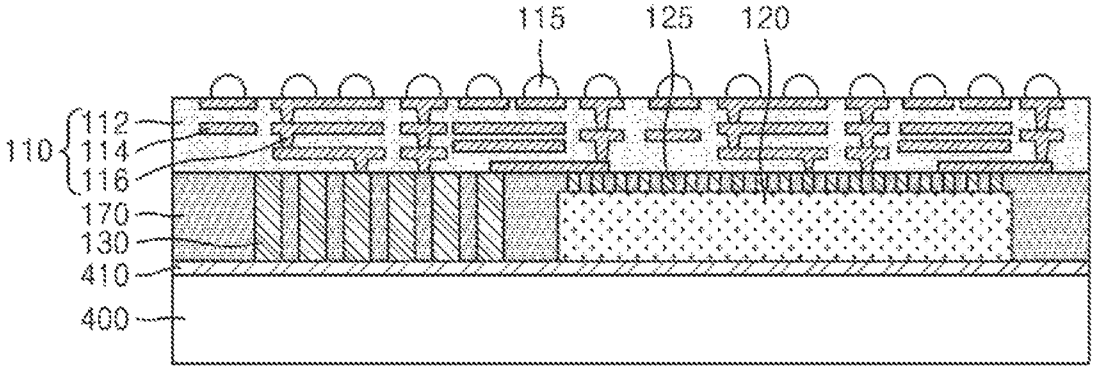
Figure 8I:
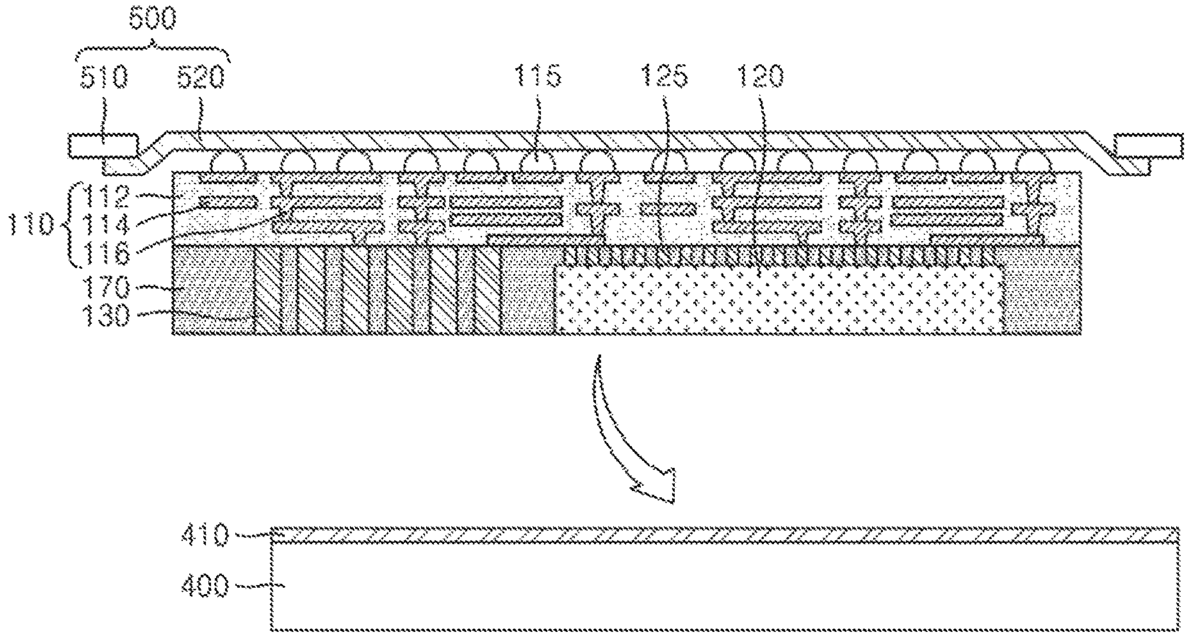
Figure 8J:
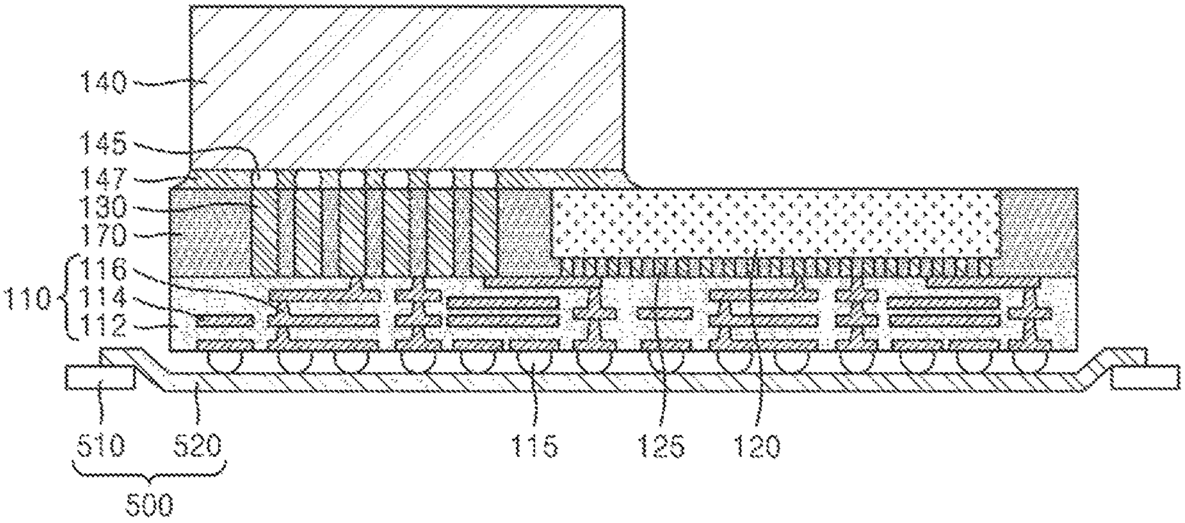
Figure 8K:
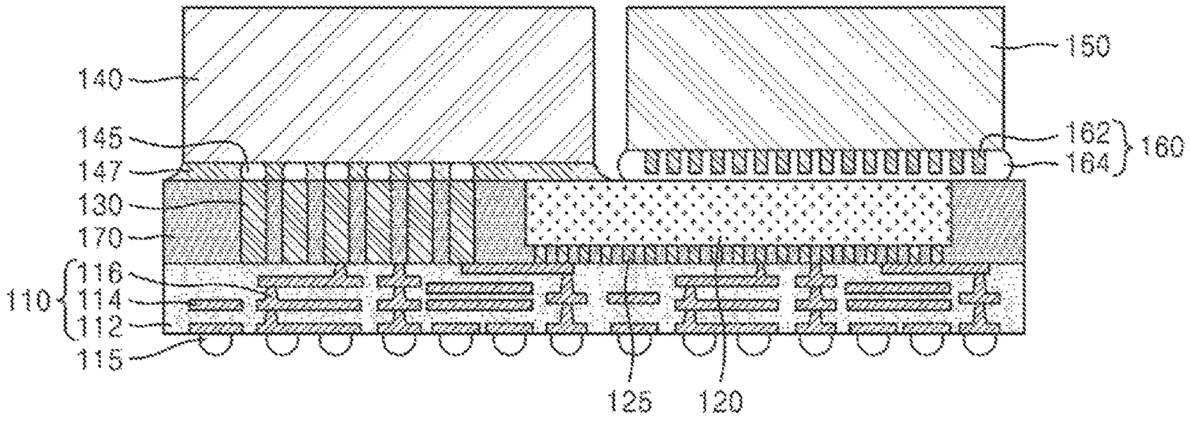
Figure 9:
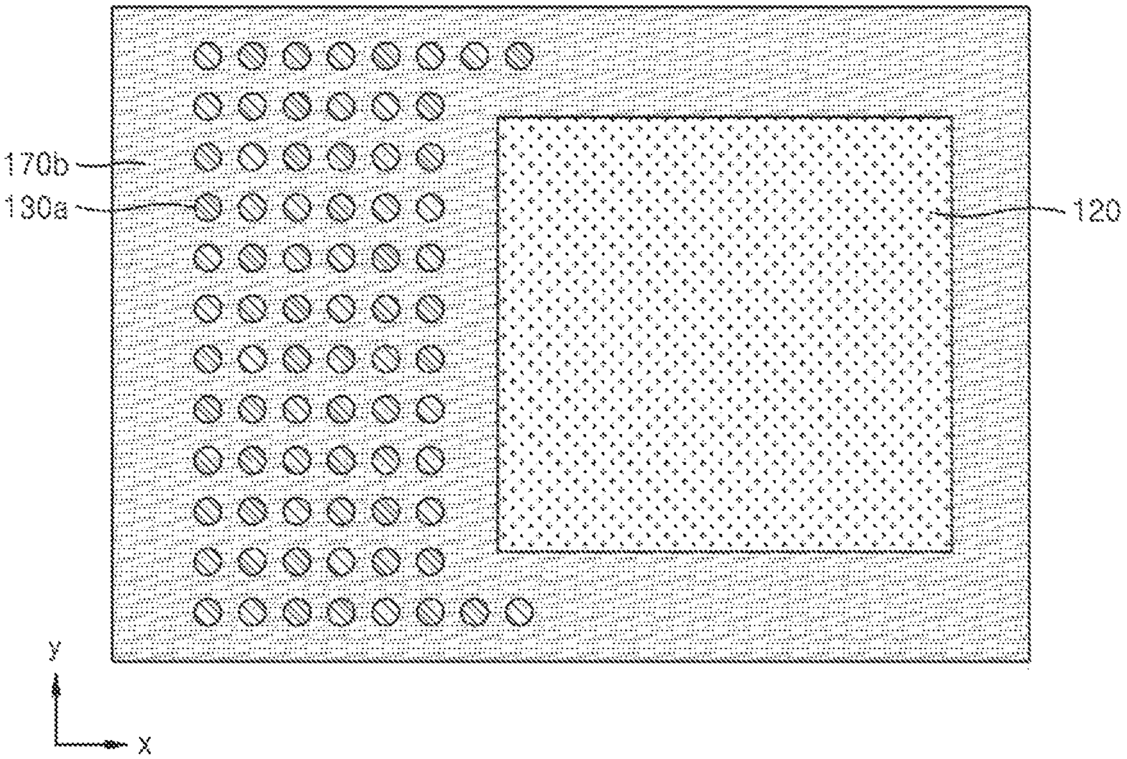
FIG. 9 is a plan view during operation of FIG. 8D.

FIGS. 8A to 8K are cross-sectional views schematically illustrating a process of a method of manufacturing the semiconductor package 100 of FIG. 1B according to an example embodiment, and FIG. 9 is a plan view during operation of FIG. 8D. A description is given below with reference to FIG. 1B together, and descriptions already given with reference to FIGS. 1A to 7 are simplified or omitted.

Referring to FIG. 8A, in a semiconductor package manufacturing method, alignment metal pads 310 and initial through-posts 130*a* are formed on a first carrier substrate 200. The alignment metal pads 310 and the initial through-posts 130*a* may be formed on a first adhesive layer 210 of the first carrier substrate 200. The first adhesive layer 210 may include, for example, a glue coating layer. However, the material of the first adhesive layer 210 is not limited to glue. The alignment metal pads 310 and the initial through-posts 130*a* may be formed through a plating process. A process of manufacturing the alignment metal pads 310 and the initial through-posts 130*a* is described in more detail in the description of FIGS. 10A to 10H.

The alignment metal pads 310 may include, for example, Cu or Ti/Cu. However, the material of the alignment metal pads 310 is not limited thereto. The alignment metal pads 310 may have fine widths and intervals. Also, the alignment metal pads 310 may allow the first semiconductor chip 120 to be self-aligned and stacked on the redistribution substrate 110. Furthermore, as the alignment metal pads 310 have fine widths and intervals, the widths and intervals of redistribution lines formed on the redistribution substrate 110, for example, the width and interval of the uppermost redistribution line, may be made very fine.

The initial through-posts 130*a* may also include Cu or Ti/Cu. However, the material of the initial through-posts 130*a* is not limited thereto. The initial through-posts 130*a* may have relatively larger widths and intervals than the alignment metal pads 310. The initial through-posts 130*a* may be arranged in a 2-dimensional array structure on at least one side of a region in which the alignment metal pads 310 are arranged.

Referring to FIG. 8B, a first semiconductor chip 120 is stacked on the alignment metal pads 310. In detail, the first semiconductor chip 120 may include initial bumps 125*a* formed on a lower surface thereof. Each of the initial bumps 125*a* may include a metal pillar 125-1 and a solder 125-2. The metal pillar 125-1 may include, for example, Cu. However, the material of the metal pillar 125-1 is not limited to Cu. The first semiconductor chip 120 may be stacked on the alignment metal pads 310 in such a way that the initial bumps 125*a* are coupled to corresponding alignment metal pads 310.

Referring to FIG. 8C, an initial sealing material 170*a* covering the initial through-posts 130*a* and the first semiconductor chip 120 is formed on the first adhesive layer 210. As shown in FIG. 8C, the initial sealing material 170*a* may cover side and upper surfaces of the initial through-posts 130*a* and the first semiconductor chip 120. Also, the initial sealing material 170*a* may fill a space between the first semiconductor chip 120 and the first adhesive layer 210 and spaces between the initial bumps 125*a*. The initial sealing material 170*a* has the same material and characteristics as the sealing material 170 of the semiconductor package 100 of FIG. 1B.

Referring to FIGS. 8D and 9, an upper portion of the initial sealing material 170*a* is partially removed, as indicated by arrows, through a first grinding process to thereby form an initial sealing material 170*b* that is thinner than the initial sealing material 170*a*. Through the first grinding process, the upper surfaces of the initial through-posts 130*a* and the first semiconductor chip 120 may be exposed through the initial sealing material 170*b*.

Also, as shown in FIG. 9, the initial through-posts 130*a* may be arranged in a 2-dimensional array structure on at least one side of the first semiconductor chip 120, for example, in a region on the left side, in an x direction, of the first semiconductor chip 120. Also, some of the initial through-posts 130*a* may be arranged in partial regions on opposite sides, in a y direction, of the first semiconductor chip 120.

Referring to FIG. 8E, after the initial sealing material 170*b* is formed, a second carrier substrate 400 is coupled to the upper surfaces of the first semiconductor chip 120, the initial through-posts 130*a*, and the initial sealing material 170*b*. The second carrier substrate 400 may be bonded and fixed to the upper surfaces of the first semiconductor chip 120, the initial through-posts 130*a*, and the initial sealing material 170*b* through a second adhesive layer 410. After the second carrier substrate 400 is coupled to the upper surfaces of the first semiconductor chip 120, the initial through-posts 130*a*, and the initial sealing material 170*b*, the first carrier substrate 200 is removed from the alignment metal pads 310, the initial through-posts 130*a*, and the initial sealing material 170*b*. The first adhesive layer 210 may be removed together with the first carrier substrate 200. However, in some example embodiments, only the first carrier substrate 200 may be removed while the first adhesive layer 210 remains.

Referring to FIG. 8F, after the first carrier substrate 200 is removed, the entire structure is turned over so that the second carrier substrate 400 is located on a lower side and the alignment metal pads 310 are located on an upper side. Subsequently, as indicated by arrows, the alignment metal pads 310 and the initial bumps 125*a* are partially removed through a second grinding process. For example, as the solders 125-2 of the initial bumps 125*a* are removed through the second grinding process, the first bumps 125 may be formed on the first semiconductor chip 120. In addition, as the initial through-posts 130*a* and the initial sealing material 170*b* are thinned through the second grinding process, the through-posts 130 and the sealing material 170 are formed together. The sealing material 170 is substantially the same as the sealing material 170 of the semiconductor package 100 of FIG. 1B and thus may have a first thickness H1.

Referring to FIG. 8G, a redistribution substrate 110 is formed on the first semiconductor chip 120, the through-posts 130, and the sealing material 170. The redistribution substrate 110 may include a body insulation layer 112, a redistribution line 114, and a via 116. As described above, the first bumps 125 of the first semiconductor chip 120 may be self-aligned using the alignment metal pads 310 and thus formed very finely. Correspondingly, redistribution lines 114 of the redistribution substrate 110 may also have very fine widths and intervals. For example, among the redistribution lines 114 of the redistribution substrate 110, a redistribution line 114 coupled to the first bumps 125 of the first semiconductor chip 120 has a line width and space of about 2/2 μm.

Referring to FIG. 8H, after the redistribution substrate 110 is formed, external connection terminals 115 are formed on the redistribution substrate 110. The external connection terminals 115 have the same features as those of the external connection terminals 115 of the semiconductor package 100 of FIG. 1B.

Referring to FIG. 8I, the external connection terminals 115 are then attached to an adhesive film 520 of a film frame mount 500. The film frame mount 500 may include a support ring 510 having a circular ring shape and the adhesive film 520 covering an open portion of the support ring 510. Accordingly, the film frame mount 500 is also referred to as a ring frame mount.

After the external connection terminals 115 of the redistribution substrate 110 are attached to the film frame mount 500, the second carrier substrate 400 is removed from the first semiconductor chip 120, the through-posts 130, and the sealing material 170. The second adhesive layer 410 may be removed together with the second carrier substrate 400.

Referring to FIG. 8J, after the second carrier substrate 400 is removed, the entire structure is turned over again, and a second semiconductor chip 140 is stacked on the through-posts 130. The second semiconductor chip 140 may be stacked through second bumps 145. Subsequently, the underfill 147 may fill a space between the second semiconductor chip 140 and the sealing material 170 and spaces between the second bumps 145. However, in some example embodiments, the underfill 147 may be omitted.

Referring to FIG. 8K, a heat dissipation chip 150 is subsequently stacked on the first semiconductor chip 120 in a region adjacent to the second semiconductor chip 140. The heat dissipation chip 150 may be stacked using a heat dissipation connector 160. The heat dissipation connector 160 may include metal pads 162 and an adhesive layer 164. The semiconductor package 100 of FIG. 1B may be completed by stacking the heat dissipation chip 150 on the first semiconductor chip 120.

FIG. 10A to 10G are cross-sectional views showing formation of the structure shown in FIG. 8A in more detail. A description is given below with reference to FIG. 1B together, and descriptions already given with reference to FIGS. 1A to 8K are simplified or omitted.

Figure 10A:
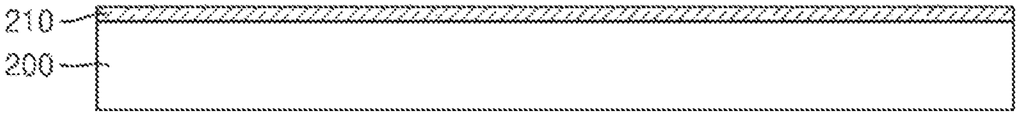
FIGS. 10A, 10B, 10C, 10D, 10E, 10F, 10G and 10H are cross-sectional views showing operation of FIG. 8A in more detail.

Referring to FIG. 10A, in a process of manufacturing the alignment metal pads

310 and the initial through-posts 130*a*, the first adhesive layer 210 is formed first on the first carrier substrate 200. The first adhesive layer 210 may include, for example, a glue coating layer. However, the material of the first adhesive layer 210 is not limited to glue.

Figure 10B:
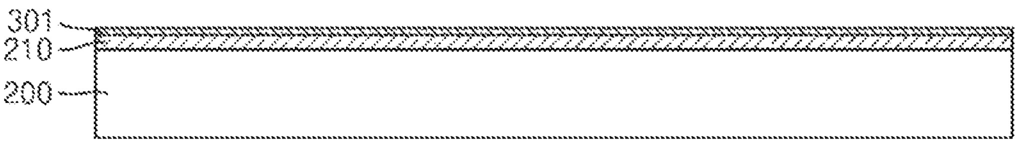

Referring to FIG. 10B, after the first adhesive layer 210 is formed, a metal seed layer 301 is formed on the first adhesive layer 210. The metal seed layer 301 may include, for example, a Cu single layer or Ti/Cu multi layers. However, the material and layer structure of the metal seed layer 301 are not limited to the materials and layer structures described above. Here, in the case of the Ti/Cu multi layers, the lower portion may include a Ti layer and the upper portion may include a Cu layer.

Figure 10C:
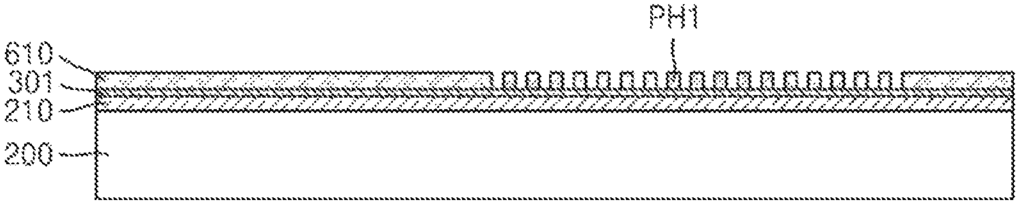

Referring to FIG. 10C, after the metal seed layer 301 is formed, a first PR pattern PH1 is formed on the metal seed layer 301. More specifically, a first PR layer 610 having a small thickness may be formed first on the entire surface of the metal seed layer 301. Subsequently, a photolithography process may be performed on the first PR layer 610 so that the first PR pattern PH1 is formed at a region in which the first semiconductor chip 120 is to be located. Here, the first PR pattern PH1 may have very fine widths and intervals considering the sizes and intervals of the alignment metal pads 310 formed later. Here, the first PR pattern PH1 may expose the metal seed layer 301 at the bottom surface thereof.

Figure 10D:
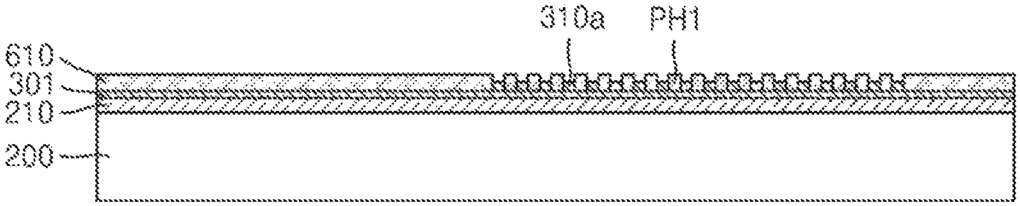

Referring to FIG. 10D, after the first PR pattern PH1 is formed, a plating process is performed on the metal seed layer 301 exposed through the first PR pattern PH1 to thereby form initial alignment metal pads 310*a*. The plating process may include, for example, a Cu plating process. However, the plating process is not limited to a Cu plating process.

Figure 10E:
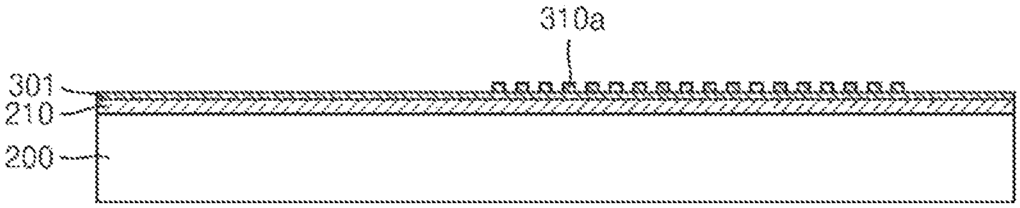

Referring to FIG. 10E, after the initial alignment metal pads 310*a* are formed, the first PR layer 610 and the first PR pattern PH1 are removed. The first PR layer 610 and the first PR pattern PH1 may be removed through a PR strip and/or ashing process. The metal seed layer 301 and the initial alignment metal pads 310*a* may be exposed by removing the first PR layer 610 and the first PR pattern PH1.

Figure 10F:
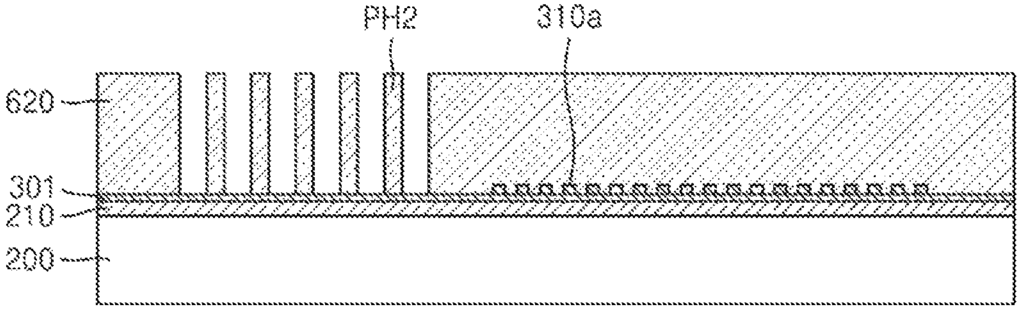

Referring to FIG. 10F, a second PR pattern PH2 is then formed in a region adjacent to the initial alignment metal pads 310*a*. More specifically, a second PR layer 620 covering the entire surface of the metal seed layer 301 and the initial alignment metal pads 310*a* may be formed to a relatively large thickness. Subsequently, a photolithography process may be performed on the second PR layer 620 so that the second PR pattern PH2 is formed at a region in which the through-posts 130 are to be arranged. Here, the second PR pattern PH2 may expose the metal seed layer 301 at the bottom surface thereof.

Figure 10G:
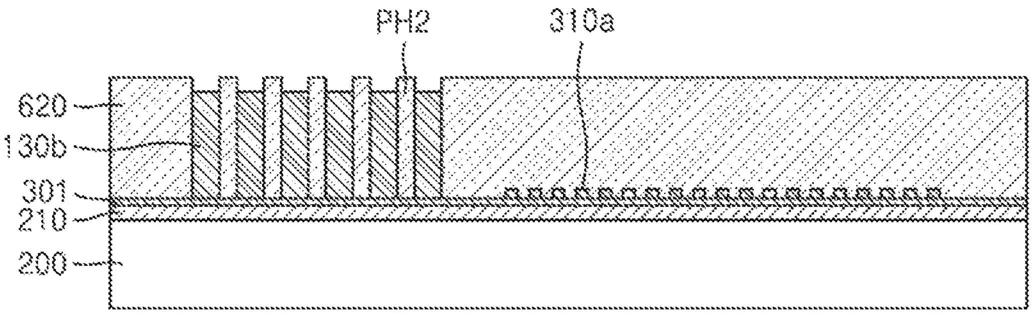

Referring to FIG. 10G, after the second PR pattern PH2 is formed, a plating process is performed on the metal seed layer 301 exposed through the second PR pattern PH2 to thereby form initial through-posts 130*b*. The plating process may include, for example, a Cu plating process. However, the plating process is not limited to the Cu plating process.

Figure 10H:
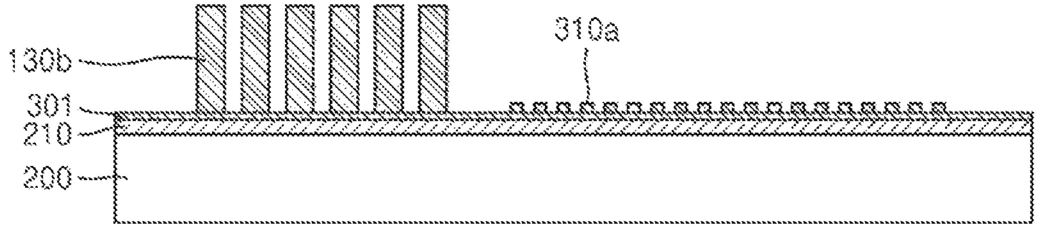

Referring to FIG. 10H, after the initial through-posts 130*b* are formed, the second PR layer 620 and the second PR pattern PH2 are removed. The second PR layer 620 and the second PR pattern PH2 may be removed through a PR strip and/or ashing process. Through the removal of the second PR layer 620 and the second PR pattern PH2, the metal seed layer 301 may be exposed between the initial through-posts 130*b*, between the initial alignment metal pads 310*a*, and outside regions in which the initial through-posts 130*b* and the initial alignment metal pads 310*a* are arranged. Subsequently, the exposed metal seed layer 301 is removed through an etching process, and thus, the initial through-posts 130*a* and the alignment metal pads 310 may be formed.

While aspects of example embodiments have been particularly shown and described, it will be understood that various changes in form and details may be made therein without departing from the spirit and scope of the following claims.

What is claimed is:

1. A semiconductor package comprising:

a redistribution substrate;

a first semiconductor chip provided on a right portion, in a first direction, of the redistribution substrate;

a through-post provided on the redistribution substrate in a region adjacent to a left side, in the first direction, of the first semiconductor chip;

a heat dissipation chip provided on the first semiconductor chip, the heat dissipation chip comprising silicon; and a second semiconductor device provided adjacent to the heat dissipation chip on the through-post, wherein a metal pad and an adhesive layer are provided between the heat dissipation chip and the first semiconductor chip, and wherein the metal pad is disposed on a lower surface of the heat dissipation chip.

2. The semiconductor package of claim 1, further comprising a sealing material on the redistribution substrate and surrounding the first semiconductor chip and the through-post, wherein an upper surface of the first semiconductor chip is exposed between the second semiconductor chip and the heat dissipation chip through the sealing material, and wherein an upper surface of the through-post is exposed through the sealing material.

3. The semiconductor package of claim 1, wherein the adhesive layer comprises a thermal interface material (TIM), a polymer, or an oxide.

4. The semiconductor package of claim 1, wherein a gap between a lower surface of the metal pad and an upper surface of the first semiconductor chip is 1 μm or less, and wherein the adhesive layer extends into the gap.

5. The semiconductor package of claim 1, wherein the first semiconductor chip comprises a logic circuit, and wherein the second semiconductor device comprises a memory circuit.

6. The semiconductor package of claim 5, wherein the second semiconductor device has a single chip structure or a package structure in which a plurality of chips are stacked.

7. The semiconductor package of claim 1, wherein the heat dissipation chip comprises a metal line and silicon.

8. The semiconductor package of claim 1, wherein the redistribution substrate comprises a plurality of wiring lines provided in a plurality of layers of the redistribution substrate, and wherein a pitch of a first wiring line, which is on an uppermost layer of the plurality of layers and is coupled to the first semiconductor chip, is less than pitches of wiring lines on remaining layers of the plurality of layers below the first wiring line.

9. The semiconductor package of claim 8, wherein a line width of the first wiring line is 2 μm, and wherein a line space of the first wiring line is 2 μm.

10. The semiconductor package of claim 1, wherein the redistribution substrate comprises a plurality of wiring lines provided in a plurality of layers of the redistribution substrate, wherein a first bump is provided between the first semiconductor chip and the redistribution substrate, wherein a second bump is provided between the second semiconductor device and the through-post, and wherein the second semiconductor device is electrically connected to the first semiconductor chip through the second bump, the through-post, the plurality of wiring lines of the redistribution substrate, and the first bump.

11. The semiconductor package of claim 1, further comprising a heat sink on the second semiconductor device and the heat dissipation chip.

12. A semiconductor package comprising:

a redistribution substrate comprising a plurality of wiring lines in a plurality of layers;

a first semiconductor chip provided on a right portion, in a first direction, of the redistribution substrate through a first bump;

a through-post provided on the redistribution substrate in a region adjacent to a left side, in the first direction, of the first semiconductor chip;

a sealing material provided on the redistribution substrate, surrounding the first semiconductor chip and the through-post, and exposing upper surfaces of the first semiconductor chip and the through-post;

a heat dissipation chip provided on the first semiconductor chip, wherein the heat dissipation chip comprises silicon, and a metal pad and an adhesive layer are provided between the heat dissipation chip and the first semiconductor chip; and a second semiconductor chip provided adjacent to the heat dissipation chip on the through-post, wherein a second bump is provided between the through-post and the second semiconductor chip, wherein the metal pad is disposed on a lower surface of the heat dissipation chip.

13. The semiconductor package of claim 12, wherein the through-post extends through the sealing material to connect the redistribution substrate and the second semiconductor chip to each other.

14. The semiconductor package of claim 12, wherein the through-post comprises a plurality of through-posts, wherein the first semiconductor chip is provided between two of the plurality of through-posts, in a second direction perpendicular to the first direction.

15. The semiconductor package of claim 12, wherein a left portion of the first semiconductor chip overlaps the second semiconductor chip in a direction perpendicular to an upper surface of the redistribution substrate.

16. The semiconductor package of claim 12, wherein a pitch of a first wiring line, which is on an uppermost layer of the plurality of layers and is coupled to the first semiconductor chip, is less than pitches of wiring lines on remaining layers of the plurality of layers below the first wiring line.

17. The semiconductor package of claim 12, wherein the second semiconductor chip is electrically connected to the first semiconductor chip through the second bump, the through-post, the plurality of wiring lines of the redistribution substrate, and the first bump.

18. A semiconductor package comprising:

a redistribution substrate having a lower surface, on which an external connection terminal is provided, and comprising a plurality of wiring lines in a plurality of layers;

a first semiconductor chip provided on a right portion, in a first direction, of the redistribution substrate through a first bump;

a plurality of through-posts provided on the redistribution substrate in a region adjacent to a left side, in the first direction, of the first semiconductor chip and in regions on opposite sides, in a second direction perpendicular to the first direction, of the first semiconductor chip;

a sealing material provided on the redistribution substrate, covering side surfaces of the first semiconductor chip and the plurality of through-posts, and exposing upper surfaces of the first semiconductor chip and the plurality of through-posts;

a heat dissipation chip provided on the first semiconductor chip through a metal pad and an adhesive layer, the heat dissipation chip comprising silicon; and a second semiconductor chip provided adjacent to the heat dissipation chip on the plurality of through-posts through a second bump, wherein the metal pad is disposed on a lower surface of the heat dissipation chip.

19. The semiconductor package of claim 18, wherein a gap between a lower surface of the metal pad and the upper surface of the first semiconductor chip is 1 μm or less.

20. The semiconductor package of claim 18, wherein the second semiconductor chip is electrically connected to the first semiconductor chip through the second bump, the plurality of through-posts, the plurality of wiring lines of the redistribution substrate, and the first bump.

* * * * *